(12) United States Patent
Lee

(10) Patent No.: US 6,924,677 B2
(45) Date of Patent: Aug. 2, 2005

(54) PHASE-LOCKED LOOP INTEGRATED CIRCUITS THAT SUPPORT CLOCK SIGNAL UPDATES DURING DEAD ZONE COMPENSATION TIME INTERVALS

(75) Inventor: Kun Seok Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/640,075

(22) Filed: Aug. 13, 2003

(65) Prior Publication Data

US 2004/0178834 A1 Sep. 16, 2004

(30) Foreign Application Priority Data

Mar. 13, 2003 (KR) .................. 10-2003-0015864

(51) Int. Cl.[7] ............................................... H03L 7/06
(52) U.S. Cl. ..................................... 327/147; 327/156
(58) Field of Search ............................. 327/3, 5, 7, 8, 327/9, 12, 156, 157, 147, 148; 331/25; 375/374, 375, 376

(56) References Cited

U.S. PATENT DOCUMENTS

| | | | |
|---|---|---|---|
| 4,322,643 A | 3/1982 | Preslar .......................... 327/5 |
| 5,485,125 A | * 1/1996 | Dufour .......................... 331/17 |
| 5,821,817 A | 10/1998 | McCorkle .................... 331/1 A |
| 5,828,255 A | 10/1998 | Kelkar et al. ................ 327/157 |
| 5,977,801 A | * 11/1999 | Boerstler ........................ 327/7 |
| 6,094,078 A | 7/2000 | Suzuki .......................... 327/156 |
| 6,124,741 A | 9/2000 | Arcus .......................... 327/112 |
| 6,147,561 A | 11/2000 | Rhee et al. .................... 331/12 |
| 6,192,094 B1 | 2/2001 | Herrmann et al. .......... 375/375 |
| 6,226,339 B1 | 5/2001 | Nam et al. ................... 375/376 |
| 6,346,861 B2 | 2/2002 | Kim et al. ...................... 331/8 |
| 6,356,158 B1 | 3/2002 | Lesea .......................... 331/11 |
| 6,362,670 B1 | 3/2002 | Beaulieu ..................... 327/156 |
| 6,366,144 B2 | 4/2002 | Han .............................. 327/156 |
| 6,373,913 B1 | 4/2002 | Lee .............................. 375/376 |
| 6,424,193 B1 | 7/2002 | Hwang ........................ 327/158 |
| 6,430,244 B1 | 8/2002 | Ryu .............................. 375/376 |
| 6,434,206 B1 | 8/2002 | Yu ................................ 375/376 |
| 6,496,554 B1 | 12/2002 | Ahn ............................ 375/376 |
| 6,542,040 B1 | 4/2003 | Lesea .......................... 331/11 |
| 6,542,041 B2 | 4/2003 | Choi ............................ 331/17 |
| 6,545,547 B2 | 4/2003 | Fridi et al. .................... 331/16 |
| 6,549,765 B2 | 4/2003 | Welland et al. ............. 455/260 |
| 6,566,088 B1 | 5/2003 | McKnight et al. .......... 435/124 |
| 6,566,920 B1 | 5/2003 | Kim ............................ 327/147 |
| 6,583,657 B1 | 6/2003 | Eckhardt et al. ............ 327/175 |
| 6,587,005 B2 | 7/2003 | Ichihara ....................... 331/16 |
| 6,594,330 B1 | 7/2003 | Wilson ........................ 375/376 |
| 2002/0154722 A1 | * 10/2002 | Djahanshahi et al. ....... 375/375 |

FOREIGN PATENT DOCUMENTS

JP 2000-295097 10/2000

OTHER PUBLICATIONS

Notice to Submit Response, Japanese Application No. 10-2003-0015864, Jan. 26, 2005.

* cited by examiner

Primary Examiner—Linh My Nguyen
(74) Attorney, Agent, or Firm—Myers Bigel Sibley & Sajovec

(57) ABSTRACT

PLL integrated circuits include a charge pump having first and second input terminals that are configured to receive UP and DOWN control signals, respectively. A phase detector is also provided. The phase detector is configured to generate the UP and DOWN control signals at active levels during a dead zone compensation time interval using a control circuit that is responsive to at least one signal generated by the charge pump. The control circuit is further configured to support reference clock signal and/or feedback clock signal updates to the phase detector during the dead zone compensation time interval.

11 Claims, 8 Drawing Sheets

PHASE-LOCKED LOOP INTEGRATED CIRCUITS THAT SUPPORT CLOCK SIGNAL UPDATES DURING DEAD ZONE COMPENSATION TIME INTERVALS

REFERENCE TO PRIORITY APPLICATION

This application claims priority to Korean Application Ser. No. 2003-15864, filed Mar. 13, 2003, the disclosure of which is hereby incorporated herein by reference.

FIELD OF THE INVENTION

The present invention relates to integrated circuit devices and, more particularly, to integrated circuit devices that utilize phase detectors when generating periodic signals.

BACKGROUND OF THE INVENTION

Phase-locked loop (PLL) integrated circuits are frequently used to generate highly accurate internal clock signals on an integrated circuit substrate. As illustrated by FIG. 1, a conventional PLL integrated circuit 10 may include a phase detector 12, a charge pump 14, a loop filter 16, a voltage controlled oscillator (VCO) 18, a clock decoder and buffer 20, and a frequency divider 22. The phase detector 12 may be configured to generate UP and DOWN control signals in response to a reference clock signal (CKREF) and a feedback clock signal (CKVCO). In particular, the phase detector 12 may be configured to compare the phases of the clock signals and generate an active UP signal or an active DOWN signal when the feedback clock signal CKVCO lags or leads the reference clock signal CKREF. As will be understood by those skilled in the art, the reference clock signal (CKREF) may be a buffered version of an external clock signal (not shown) that is received by an integrated circuit chip. The charge pump 14 may be operative to convert the digitally encoded UP and DOWN control signals into an analog output (POUT) that sources current to or sinks current from the loop filter 16. The loop filter 16 is illustrated as generating a control voltage (Vcontrol), which is provided as an input to the VCO 18. The VCO 18 may generate a plurality of outputs, which are provided to the clock decoder and buffer 20. One of the outputs of the clock decoder and buffer 20 (shown as clock signal $\phi 1$) may be provided as an input to the frequency divider 22, which generates the feedback clock signal CKVCO. An active UP signal operates to increase the value of Vcontrol, which speeds up the VCO 18 and causes the feedback clock signal CKVCO to catch up with the reference clock signal CKREF. On the other hand, an active DOWN signal slows down the VCO 18 and eliminates the phase lead of the feedback clock signal CKVCO. These and other aspects of the PLL 10 of FIG. 1 are more fully illustrated and described at section 9.5.2 of a textbook by Jan M. Rabaey, entitled Digital Integrated Circuits: A Design Perspective, Prentice-Hall, ISBN 0-13-178609-1, pp. 540–542.

FIG. 2 illustrates a conventional charge pump 14 having both pull-up and pull-down sections. The pull-up section includes an NMOS pull-down transistor N1 in series with a resistor R1. A pull-up current mirror is provided by PMOS transistors P1 and P2. The NMOS pull-down transistor N1 is responsive to the UP control signal. When the UP control signal is active at a logic 1 level, the NMOS pull-down transistor N1 turns on and pulls-down the drain and gate of PMOS transistor P1. The feedback signal line NMOS_ON is also switched high-to-low. This causes both PMOS transistors P1 and P2 to turn on and provide a sourcing current ($I_{source}$) to the output terminal (POUT) of the charge pump 14. The pull-down section includes a PMOS pull-up transistor P3 in series with a resistor R2. A pull-down current mirror is provided by NMOS transistors N2 and N3. The gate of the PMOS pull-up transistor P3 is connected to an output of an inverter I1, which receives the DOWN control signal. When the DOWN control signal is active at a logic 1 level, the PMOS pull-up transistor P3 turns on and pulls-up the drain and gate of NMOS transistor N2. The feedback signal line PMOS_ON is also switched low-to-high. This causes both NMOS transistors N2 and N3 to turn on and withdraw a sinking current ($I_{sink}$) from the output terminal POUT. When the control signals UP and DOWN are both active at logic 1 levels, the pull-up and pull-down sections are simultaneously active. The pull-up and pull-down sections of the charge pump may be balanced so that $I_{source}$ equals $I_{sink}$ and no net current is provided to or withdrawn from the output terminal POUT. A similar charge pump is illustrated at FIG. 4 of commonly assigned U.S. Pat. No. 6,430,244 to Rhu, entitled "Digital Phase-Locked Loop Apparatus With Enhanced Phase Error Compensating Circuit," the disclosure of which is hereby incorporated by reference.

FIG. 3A illustrates a conventional phase detector 12 that utilizes a delay device D1 to provide a dead zone compensation time interval during which both the UP and DOWN control signals are temporarily active. Maintaining the UP and DOWN control signals at active levels during an overlapping time interval prevents a "dead zone" from occurring when the phases of the reference clock signal CKREF and the feedback clock signal CKVCO are so closely aligned that the generation of any active UP control signal would otherwise be immediately canceled by the generation of any active DOWN control signal and vice versa. As described in U.S. Pat. No. 4,322,643 to Prescar and U.S. Pat. No. 6,192,094 to Herrmann et al., and in an article by X. Zhang entitled "Analysis and Verification on Side Effect of Anti-Backlash Delay in Phase-Frequency Detector," Microwave Theory and Techniques Society (MTT-S) Digest, IEEE International Microwave Symposium, pp. 17–20, Jun. 8–13, 2003, the delay device D1 may also be referred to as an "anti-backlash" delay unit. The phase detector 12 is illustrated as including a pair of D-type flip-flops (DFF1 and DFF2), a NAND gate ND1, an inverter I2 and a delay device D1. The D-type flip-flops are synchronized with the reference and feedback clock signals CKREF and CKVCO. A rising edge of the reference clock signal CKREF will cause the true output Q1 of DFF1 to switch high and a rising edge of the feedback clock signal CKVCO will cause the true output Q2 of DFF2 to switch high. To prevent dead zone operation, the UP and DOWN control signals remain active whenever a rising edge of the reference clock signal CKREF is registered (by DFF1) while the DOWN control signal is active or whenever a rising edge of the feedback clock signal CKVCO is registered (by DFF2) while the UP control signal is active. Setting the UP and DOWN control signals to logic 1 levels causes the output of the NAND gate ND1 to switch high-to-low and the output of the inverter I2 to switch low-to-high. This low-to-high switching at the output of inverter I2 is delayed by a fixed time amount equal to $T_1$, by the delay device D1. The delay $T_1$ may be about 5 nanoseconds in some cases. The reset signal RST at the output of the delay device D1 will switch low-to-high some time after the output of the inverter I2 switches low-to-high in response to simultaneously active UP and DOWN control signals. When active, the reset signal RST operates to reset the flip-flops DFF1 and DFF2 (Q1=Q2=0). Upon reset, the UP and DOWN control signals will switch to inactive levels and the output POUT of the charge pump 14 of FIG. 2 will be disposed in a high impedance state. Operation of the phase detector 12 of FIG. 3A will now be described more fully with respect to FIGS. 3B–3C.

In FIG. 3B, a first rising edge of the reference clock signal CKREF causes the UP control signal at the true output Q1 of DFF1 to switch low-to-high. Following this, a first rising edge of the feedback clock signal CKVCO causes the DOWN control signal at the true output Q2 of DFF2 to switch low-to-high. This initial overlap of the active UP and DOWN control signals causes the input of the delay device D1 to switch high. Then, the reset signal RST switches low-to-high after a time period equal to about $T_1$ (or equal to $T_1$ if the delays associated with the logic elements ND1 and 12 are ignored). This time period $T_1$ represents the duration of the dead zone compensation time interval during which both of the control signals UP and DOWN remain at active levels to prevent dead zone operation when the phases of the CKREF and CKVCO are closely aligned. In response to the low-to-high transition of the reset signal RST, the true outputs Q1 and Q2 are switched high-to-low and the output of inverter I2 then switches high-to-low. The high-to-low transition at the output of the inverter I2 is reflected in a high-to-low transition of the reset signal RST after a time period equal to $T_1$. Unfortunately, the overlap between the active UP and DOWN control signals (i.e., true outputs Q1 and Q2) for a duration of about $T_1$ causes the phase detector 12 of FIG. 3A to miss a rising edge of an incoming reference clock signal CKREF during the overlap time period. This missed edge is highlighted in FIG. 3B. As will be understood by those skilled in the art, this failure to recognize a rising edge of the incoming reference clock signal CKREF can cause gain inversion and reduce the lock time of the phase detector 12. Gain inversion takes place when the phase detector 12 outputs the wrong control signals and causes the phase differences between the reference clock signal CKREF and feedback clock signal CKVCO to increase rather than decrease. This is reflected in FIG. 3B by the failure to maintain an active UP control signal during the time period extending between the first and second rising edges of the feedback clock signal CKVCO. Accordingly, when the second rising edge of the feedback clock signal CKVCO is received, the DOWN control signal becomes active (thereby causing gain inversion) while the UP control signal remains inactive (when it should have been active in response to the missed clock signal update).

This gain inversion problem may also occur outside the dead zone compensation time interval. In particular, FIG. 3C illustrates how a clock signal update may be missed during the period when the reset signal RST is high and the true outputs Q1 and Q2 are held low. Thus, as illustrated by FIG. 3C, a time interval having a duration of about $2T_1$ represents a period during which clock signal updates are not possible within the phase detector of FIG. 3A.

SUMMARY OF THE INVENTION

Phase-locked loop (PLL) integrated circuits according to first embodiments of the present invention include a phase detector that is configured to generate overlapping UP and DOWN control signals at active levels during a dead zone compensation time interval. To prevent the occurrence of gain inversion events, a control circuit is provided that supports reference clock signal and feedback clock signal updates to the phase detector during the dead zone compensation time interval. The PLL integrated circuit also includes a charge pump that is configured to receive the UP and DOWN control signals generated by the phase detector. In some embodiments, the control circuit includes a sensor that is electrically coupled to the charge pump. This sensor is configured to generate a dead zone termination signal (END) in response to detecting receipt of overlapping UP and DOWN control signals by the charge pump. In alternative embodiments, the sensor may be configured to generate a dead zone termination signal in response to detecting generation of overlapping UP and DOWN control signals at outputs of the phase detector.

PLL integrated circuits according to other embodiments of the invention include a charge pump that is responsive to UP and DOWN control signals and a phase detector that is configured to generate the UP and DOWN control signals at active levels during a dead zone compensation time interval. The phase detector includes a control circuit that supports reference clock signal and/or feedback clock signal updates to the phase detector during the dead zone compensation time interval. The control circuit includes means, responsive to the reference clock signal and the feedback clock signal, for generating a reset signal having a leading edge that triggers a start of the dead zone compensation time interval and a delayed version of the reset signal having a leading edge that triggers termination of the dead zone compensation time interval.

According to further embodiments of the present invention, a PLL integrated circuit is provided that includes a charge pump having first and second input terminals that are configured to receive UP and DOWN control signals, respectively, and first and second control terminals that are configured to generate first and second feedback signals (e.g., NMOS_ON and PMOS_ON). These feedback signals indicate when the UP and DOWN control signals are active. A phase detector is provided. This phase detector is configured to generate the UP and DOWN control signals at active levels during a dead zone compensation time interval using a control circuit that is responsive to the first and second feedback signals generated by the charge pump. The control circuit is configured to support reference clock signal and/or feedback clock signal updates to the phase detector during the dead zone compensation time interval.

DETAILED DESCRIPTION OF PREFERRED EMBODIMENTS

Figure 1:
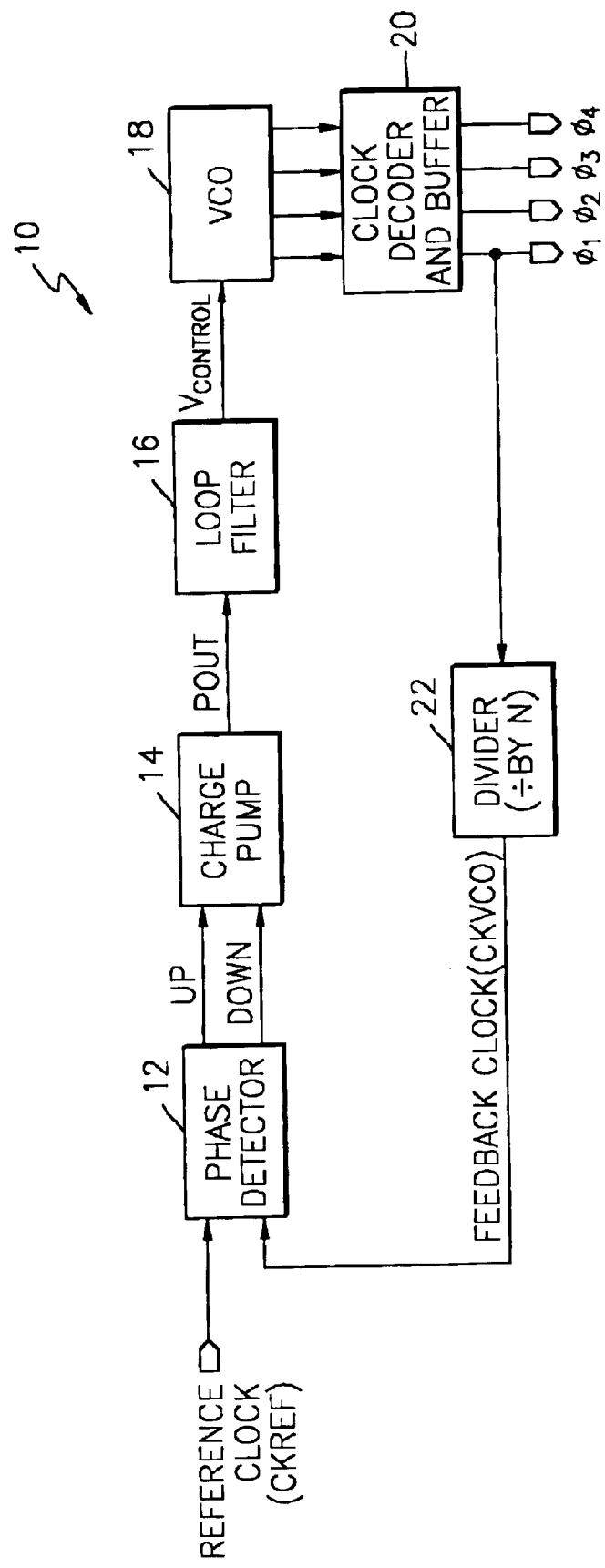
FIG. 1 is a block diagram of a conventional phase-locked loop.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 3A:
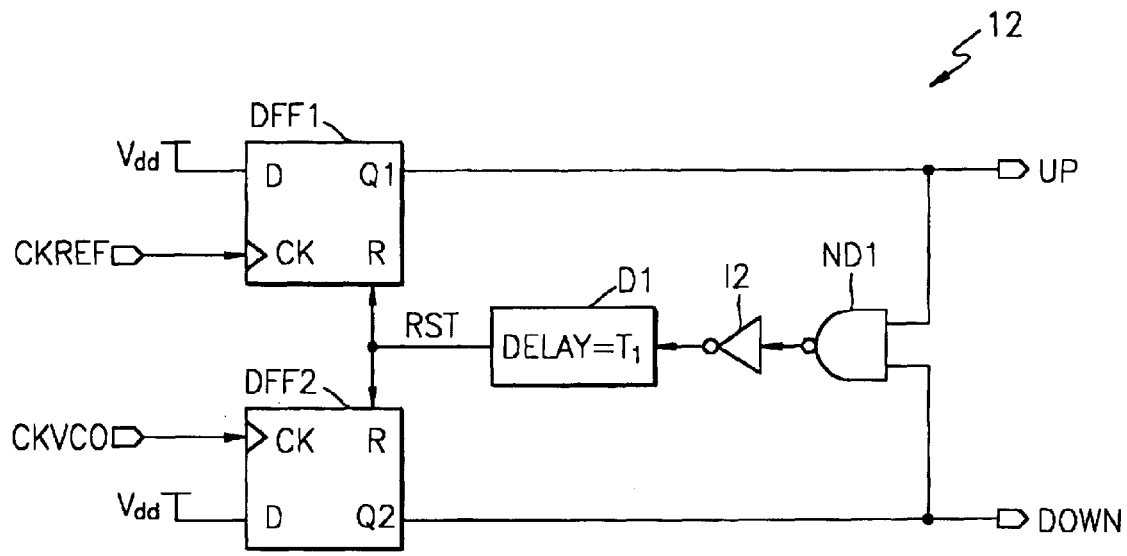
FIG. 3A is an electrical schematic of a conventional phase detector that may be used in the phase-locked loop of FIG. 1.
Figure 3B:
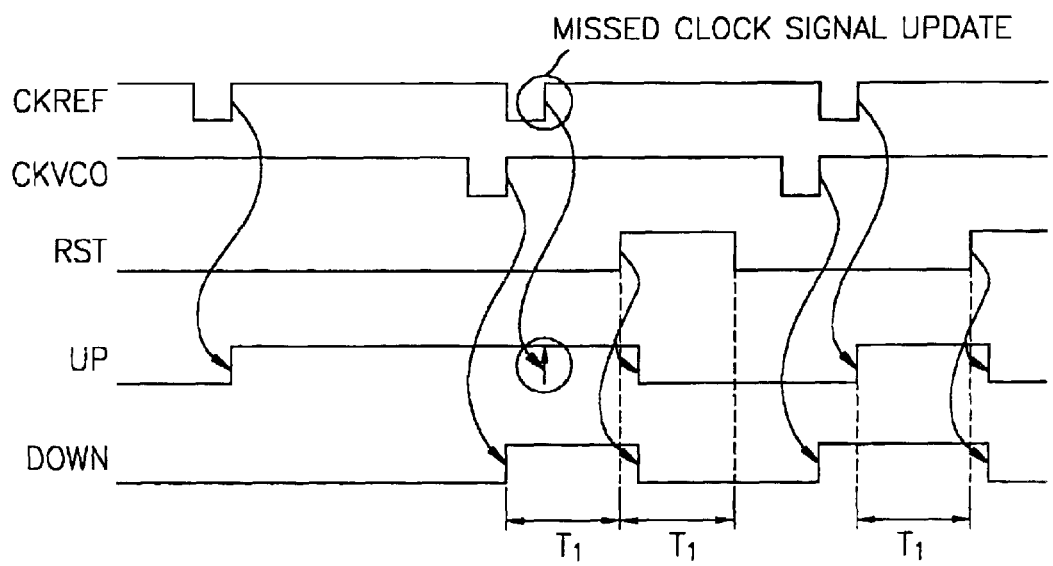
FIG. 3B is a timing diagram that illustrates operation of the phase detector of FIG. 3A under first timing conditions.
Figure 3C:
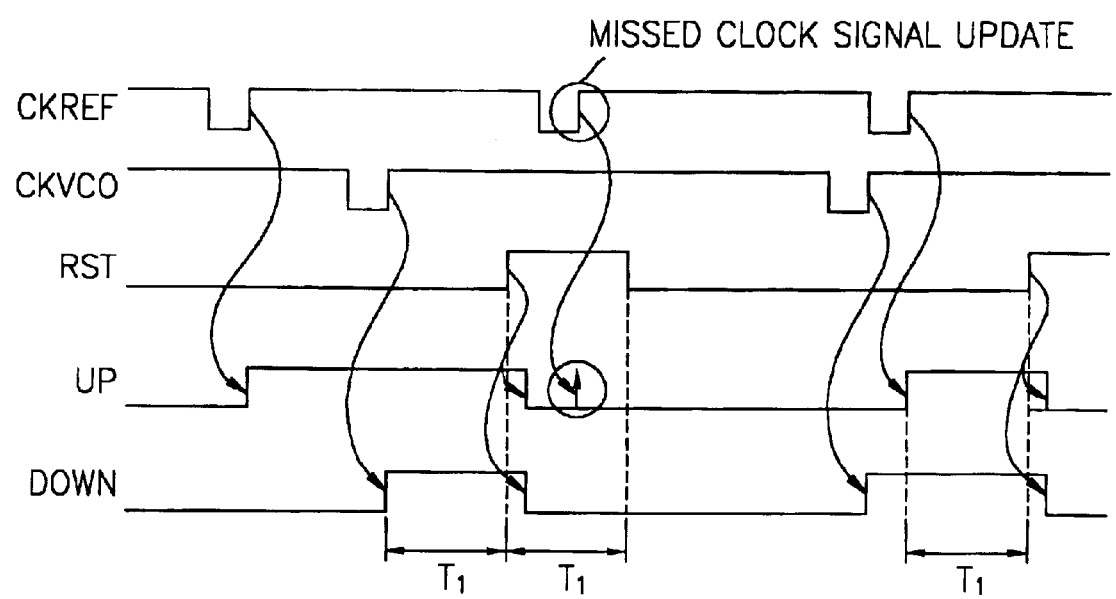
FIG. 3C is a timing diagram that illustrates operation of the phase detector of FIG. 3A under second timing conditions.
Figure 4A:
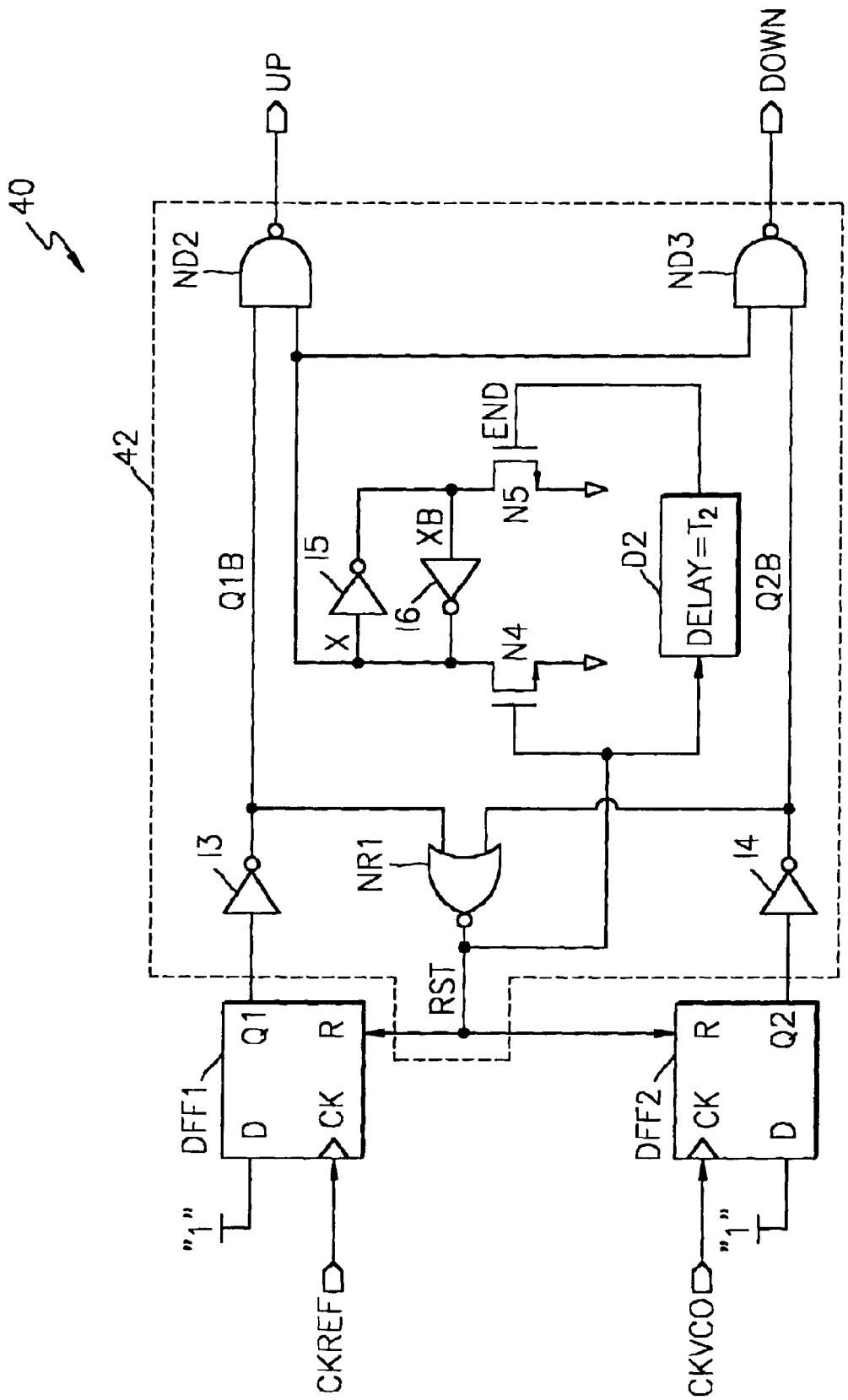
FIG. 4A is an electrical schematic of a phase detector according to a first embodiment of the present invention.

Referring now to FIG. 4A, a phase detector 40 according to a first embodiment of the present invention includes an input stage that recognizes receipt of leading edges of a pair of clock signals. These clock signals are illustrated as a reference clock signal CKREF and a feedback clock signal CKVCO. Other clock signals may also be provided. This input stage is illustrated as including a pair of D-type flip-flops, shown as DFF1 and DFF2. The true output Q1 of the first flip-flop DFF1 is latched high in response to a low-to-high edge of the reference clock signal CKREF. The true output Q2 of the second flip-flop DFF2 is latched high in response to a low-to-high edge of the feedback clock signal CKVCO. The true outputs Q1 and Q2 of the flip-flops are coupled to a control circuit 42 that provides dead zone compensation and enhanced dead zone operation that precludes gain inversion behavior. An embodiment of this control circuit 42 will now be described. An inverter I3 generates a complementary signal Q1B that is provided as an input to a NAND gate ND2 and an input to a NOR gate NR1. An inverter I4 generates a complementary signal Q2B that is provided as an input to a NAND gate ND3 and an input to the NOR gate NR1. When the true outputs Q1 and Q2 are both set to high levels, the "reset" output RST of the NOR gate NR1 switches low-to-high and operates to automatically reset both of the flip-flops DFF1 and DFF2. Thus, switching Q1 low-to-high when Q2 is already high or switching Q2 low-to-high when Q1 is already high will result in an almost immediate reset of both flip-flops DFF1 and DFF2, which means the output of the NOR gate NR1 generates a logic 1 pulse of relatively short duration. Upon reset, the first flip-flop DFF1 will be capable of recognizing any subsequent leading edge of the reference clock signal CKREF. Similarly, upon reset, the second flip-flop DFF2 will be capable of recognizing any subsequent leading edge of the feedback clock signal CKVCO. This "immediate" reset feature, which is described more fully with respect to the timing diagram of FIG. 4B, enables the control circuit 42 to support the reference clock signal CKREF and feedback clock signal CKVCO updates to the phase detector 40 during a dead zone compensation time interval. By supporting clock signal updates during the dead zone compensation time interval, gain inversion behavior of the type described above with respect to FIGS. 3A–3B can be eliminated.

Setting the complementary signal Q1B low causes the output of the NAND gate ND2 to switch high and generate an active UP control signal. Similarly, setting the complementary signal Q2B low causes the output of the NAND gate ND3 to switch high and generate an active DOWN control signal. These control signals remain active during a dead zone compensation time interval notwithstanding the "immediate" reset feature. In particular, a latch, provided by inverters I5 and I6, operates to maintain the dead zone compensation time interval after the reset signal line RST is switched high (and then low) in response to the condition that Q1=Q2=1. The output node X of the latch defined by inverters I5 and I6 is pulled low (and held low) by an NMOS transistor N4 when the reset signal line RST transitions from low-to-high. Accordingly, a leading edge of the reset pulse RST causes the NAND gates ND2 and ND3 to continue to generate overlapping UP and DOWN control signals at active levels notwithstanding the fact that the true outputs Q1 and Q2 of the flip-flops are reset to logic 0 levels in response to a low-to-high transition of the reset signal line RST. A low-to-high transition of the reset signal line RST is delayed by a delay device D2 (delay=$T_2$). The output of the delay device D2 generates a logic 1 pulse (shown as signal END) a predetermined amount of time after the reset signal RST switches low-to-high and then high-to-low. The duration of the time interval from a rising edge of the reset signal RST to the rising edge of the END signal represents the effective duration of the dead zone compensation time interval. When the END signal switches low-to-high, the NMOS transistor N5 turns on and the output node X switches low-to-high (XB switches high-to-low), and the dead zone compensation time interval is terminated. Once the dead zone compensation time interval is terminated, the control signal UP will reflect the value of the true output Q1 of the first flip-flop and the control signal DOWN will reflect the value of the true output Q2 of the second flip-flop.

Figure 4B:
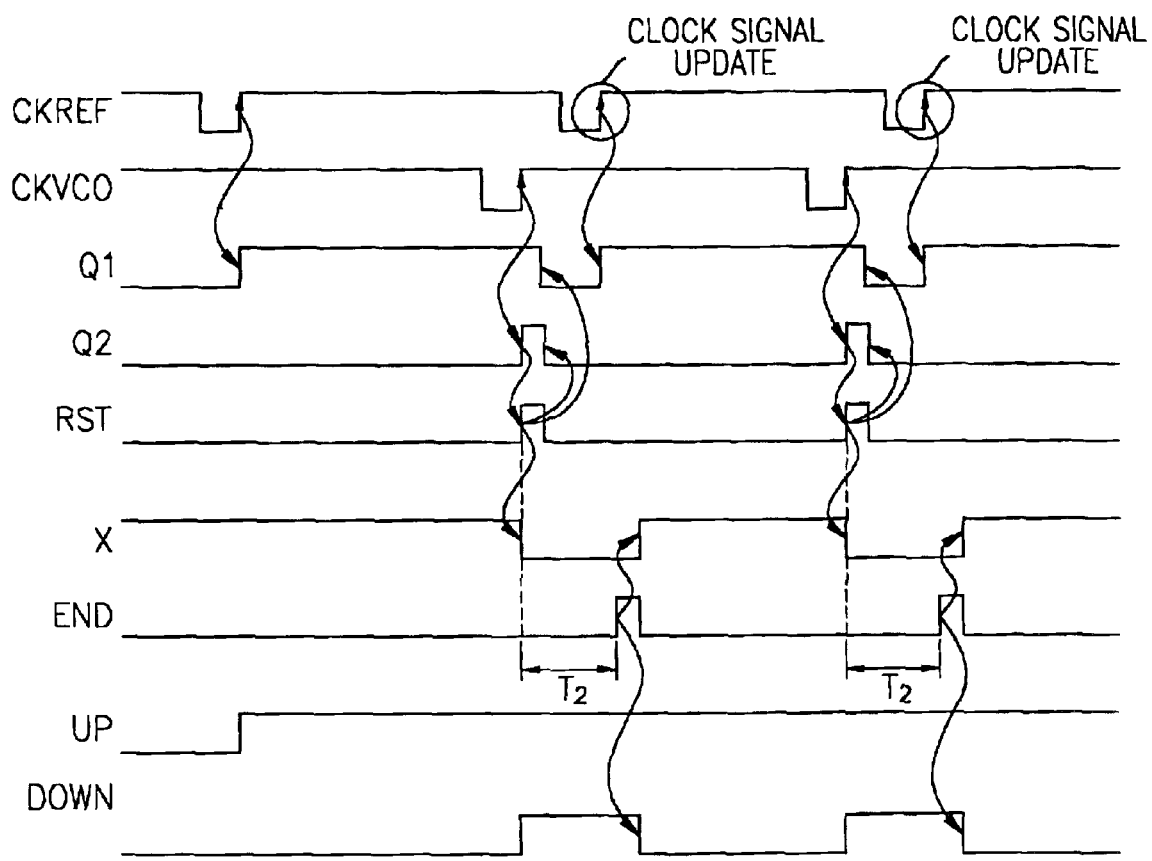
FIG. 4B is a timing diagram that illustrates operation of the phase detector of FIG. 4A and the acceptance of clock signal updates during a dead zone compensation time interval.

The phase detector 40 of FIG. 4A precludes gain inversion events by providing essentially immediate reset of the flip-flops DFF1 and DFF2 once a dead zone compensation time interval has commenced. This is further illustrated by the timing diagram of FIG. 4B, which shows the signals: CKREF, CKVCO, Q1, Q2, RST, X, END, UP and DOWN. In FIG. 4B, the high-to-low and low-to-high transitions of the output signal X (from the output node X of the latch defined by inverters I5 and I6 in FIG. 4A) identify the commencement and termination of a dead zone compensation time interval. During this time interval, any rising edge of the reference clock signal CKREF (or feedback clock signal CKVCO) will be recognized by the first flip-flop DFF1 (or second flip-flop DFF2), which means that clock signal updates will be accepted by the phase detector 40. As described above with respect to FIG. 4A, the reset pulses RST are triggered when the following condition is met: Q1=Q2=1 and the END pulses are delayed relative to the reset pulses RST by an amount equal to $T_2$, the effective duration of the dead zone compensation time interval. In response to a rising edge of the reset pulses RST, the output node X is pulled low and held low until a rising edge of a respective end pulse END is generated. The UP and DOWN control signals are both active at high levels during the dead zone compensation time interval (when X=0) and are not influenced by changes in the values of Q1 and Q2 (i.e., by the reset of DFF1 and DFF2).

Figure 2:
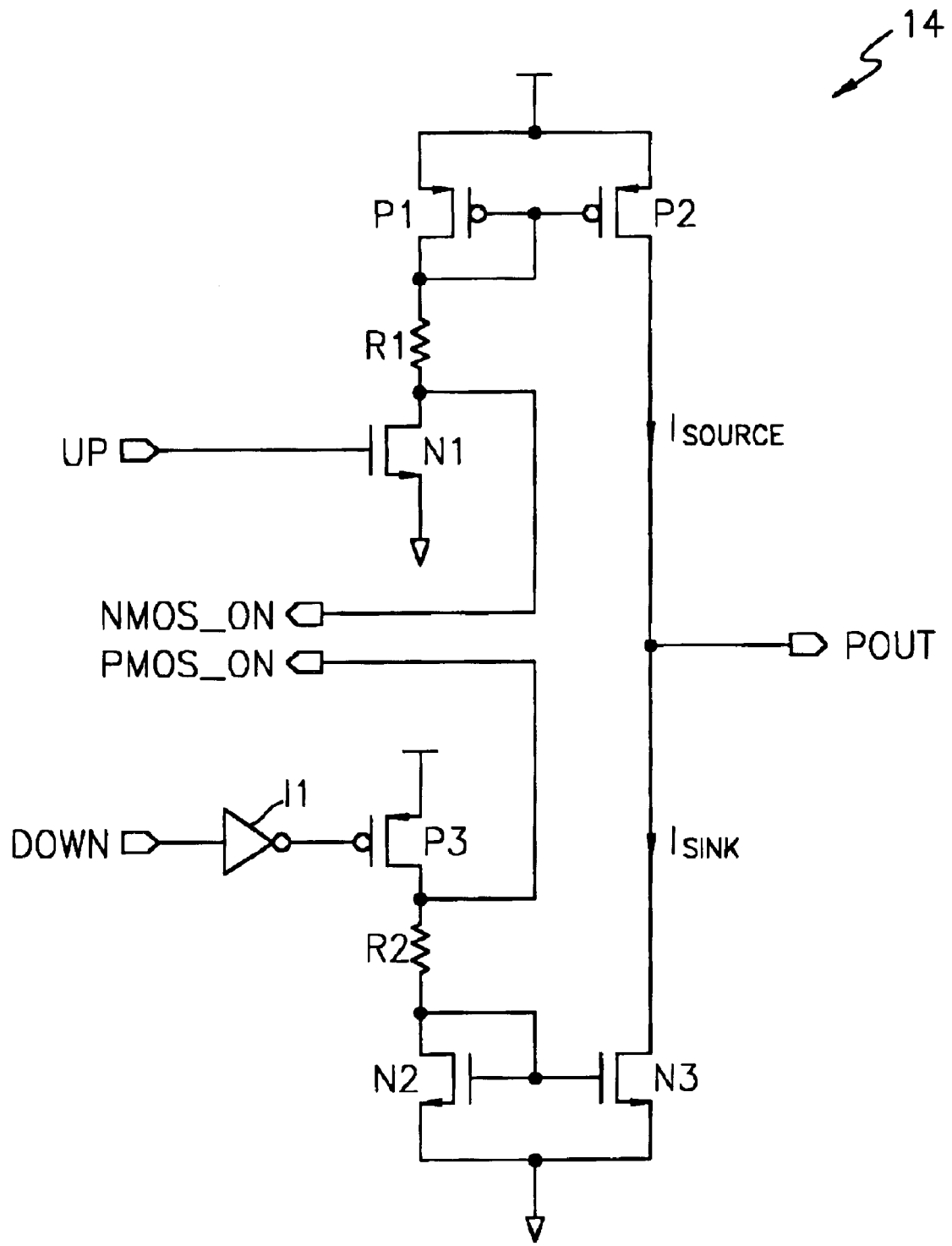
FIG. 2 is an electrical schematic of a conventional charge pump that may be used in the phase-locked loop of FIG. 1.
Figure 5:
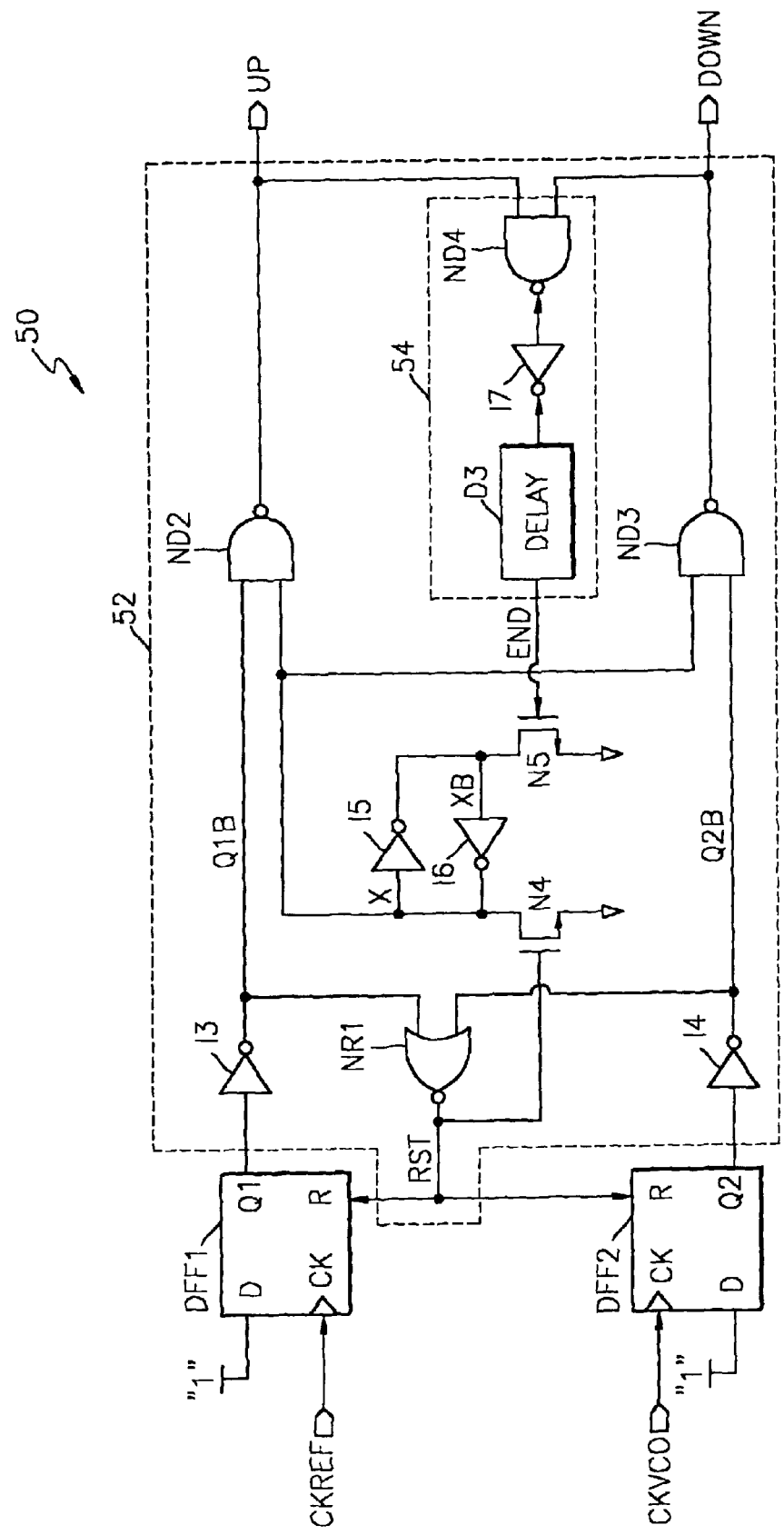
FIG. 5 is an electrical schematic of a phase detector according to a second embodiment of the present invention.
Figure 6:
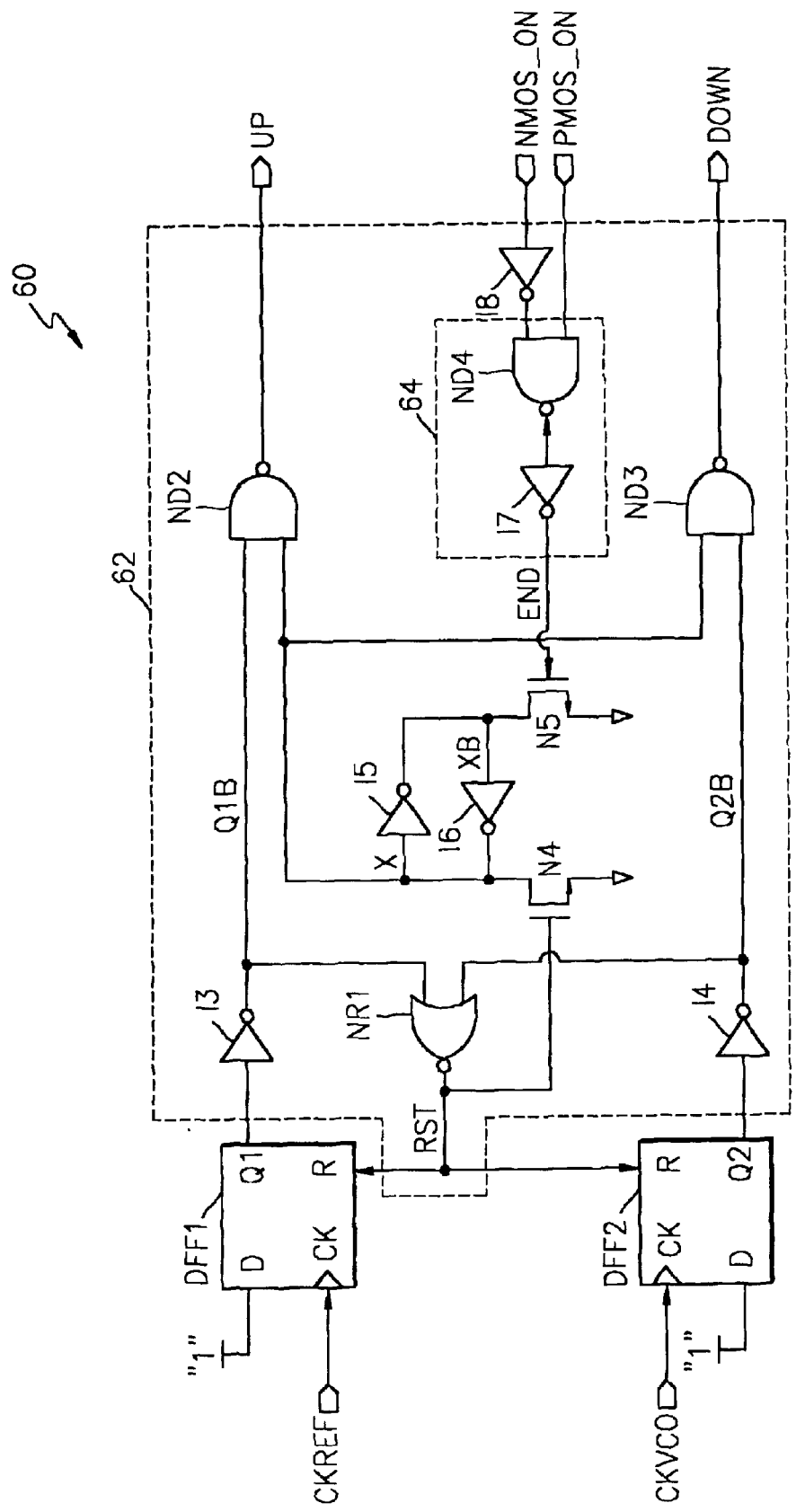
FIG. 6 is an electrical schematic of a phase detector according to a third embodiment of the present invention.

FIG. 5 illustrates a phase detector 50 according to a second embodiment of the present invention. This phase detector 50 is similar to the phase detector of FIG. 4A, however, the end pulse END is a much wider pulse that is generated by a delay device D3. As illustrated, a control circuit 52 includes an inverter I7 and a NAND gate ND4 that collectively perform a boolean "AND" operation. The delay device D3, inverter I7 and NAND gate ND4 collectively form a sensor 54 that generates the END pulse in response to detecting a presence of overlapping UP and DOWN control signals at outputs of the phase detector 50. Here, the END pulse represents a signal that specifies a termination of the dead zone compensation time interval. Based on this configuration of the sensor 54, the output of the inverter I7 is switched low-to-high (and held high) when the following condition is met: UP=DOWN=1. A leading edge of an END pulse causes the NMOS transistor N5 to turn on and the node XB to switch low. The output node X also switches high so that the levels of the signal lines Q1B and Q2B can be reflected (in inverted form) at the outputs UP and DOWN of the phase detector 50. The operation of the phase detector 50 is otherwise equivalent to the operation of the phase detector 40 illustrated by FIGS. 4A–4B. In FIG. 6, a phase detector 60 according to a third embodiment of the present invention has a control circuit 62 that does not require a delay device. Instead, a sensor 64 is provided to monitor feedback signals (NMOS_ON and PMOS_ON) generated by a charge pump 14 (see, e.g., FIG. 2). This sensor 64 includes an inverter 18, a NAND gate ND4 and an inverter I7. When the feedback signal NMOS_ON is switched low and the feedback signal PMOS_ON is switched high in response to active UP and DOWN control signals, the END signal will be switched low-to-high and the output node X of the latch will be switched and held high. Accordingly, the termination of each dead zone compensation time interval is controlled by internal operation within a charge pump 14. This internal operation provides an inherent amount of delay which supports a sufficiently long time interval to prevent dead zone operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-locked loop (PLL) integrated circuit, comprising:
    a phase detector that is configured to generate overlapping UP and DOWN control signals at active levels during a dead zone compensation time interval using a control circuit that supports reference clock signal and/or feedback clock signal updates to said phase detector during the dead zone Compensation time interval; and
    a charge pump that is configured to receive the UP and DOWN control signals generated by said phase detector;
    wherein said control circuit comprises a sensor that is electrically coupled to said charge pump and is configured to generate a dead zone termination signal in response to detecting receipt of overlapping UP and DOWN control signals by said charge pump.

2. A phase-locked loop (PLL) integrated circuit, comprising:
    a phase detector that is configured to generate overlapping UP and DOWN control signals at active levels during a dead zone compensation time interval using a control circuit that supports reference clock signal and/or feedback clock signal updates to said phase detector during the dead zone compensation time interval; and
    wherein said control circuit comprises a sensor that is configured to generate a dead zone termination signal in response to detecting generation of overlapping UP and DOWN control signals at outputs of said phase detector.

3. The PLL integrated circuit of claim 2, wherein the sensor comprises a delay element that is configured to space a leading edge of the dead zone termination signal relative to a leading edge of a reset signal that indicates commencement of the dead zone compensation time interval.

4. A phase-locked loop (PLL) integrated circuit, comprising:
    a phase detector that is responsive to first and second clock signals, said phase detector configured to generate first and second output signals at active levels during a dead zone compensation time interval using a control circuit that supports first clock signal and/or second feedback clock signal updates during the dead zone compensation time interval; and
    a charge pump that is configured to receive the first and second output signals generated by said phase detector;
    wherein said control circuit comprises a sensor that is electrically coupled to said charge pump and is configured to generate a dead zone termination signal in response to detecting receipt of overlapping first and second output signals by said charge pump.

5. A phase-locked loop (PLL) Integrated circuit, comprising:
    a charge pump having first and second input terminals that are configured to receive UP and DOWN control signals, respectively; and
    a phase detector that is configured to generate the UP and DOWN control signals at active levels during a dead zone compensation time interval using a control circuit that is responsive to at least one signal generated by said charge pump and is configured to support reference clock signal and/or feedback clock signal updates to said phase detector during the dead zone compensation time interval.

6. The PLL integrated circuit of claim 5, wherein said phase detector comprises a sensor that is configured to receive the at least one signal generated by said charge pump.

7. The PLL integrated circuit of claim 6, where said phase detector comprises:
    at least one logic device that is configured to generate a leading edge of a reset signal that triggers commencement of the dead zone compensation time interval; and
    a latching circuit that is responsive to the reset signal.

8. The PLL Integrated circuit of claim 7, wherein said latching circuit is coupled to an output of said sensor.

9. A phase-locked loop (PLL) integrated circuit, comprising:
    a phase detector that is configured to generate UP and DOWN control signals at active levels during a dead zone compensation time interval and is further configured to support first clock signal and second clock signal updates to said phase detector during the dead zone compensation time interval, said phase detector comprising:
    a first flip-flop having clock input that is configured to receive the first clock signal;
    a second flip-flop having a clock input that is configured to receive the second clock signal; and
    a control circuit that is electrically coupled to an output of said first flip-flop and an output of said second flip-flop, said control circuit having at least one logic gate therein that is configured to generate a leading edge of a reset signal to said first and second flip-flops at commencement of the dead zone compensation time interval;

wherein said control circuit comprising a latching circuit that is responsive to the reset signal, said latching circuit having a output that is held in a first logic state during the dead zone compensation time interval and held in a second logic state when dead zone compensation is not present.

10. The PLL integrated circuit of claim 9, further comprising a charge pump that is responsive to the UP and DOWN control signals; and wherein said control circuit comprises a sensor that is responsive to at least one signal generated by said charge pump.

11. A phase-locked loop (PLL) integrated circuit, comprising:

a charge pump having first and second input terminals that are configured to receive UP and DOWN control signals, respectively, and first and second control terminals that are configured to generate first and second feedback signals that indicate when the UP and DOWN control signals are active, respectively; and a phase detector that is configured to generate the UP and DOWN control signals at active levels during a dead zone compensation time interval using a control circuit that is responsive to the first and second feedback signals generated by said charge pump and is configured to support reference clock signal and/or feedback clock signal updates to said phase detector during the dead zone compensation time interval.

* * * * *